(12) United States Patent
Bodo

(10) Patent No.: US 6,480,925 B1
(45) Date of Patent: Nov. 12, 2002

(54) COMPACT AND VERSATILE SCA TO SCSI BUS ADAPTER

(75) Inventor: Martin J. Bodo, Mountain View, CA (US)

(73) Assignee: Computer Performance, Inc., Sunnyvale, CA (US)

( * ) Notice: Subject to any disclaimer, the term of this patent is extended or adjusted under 35 U.S.C. 154(b) by 0 days.

(21) Appl. No.: 08/584,484

(22) Filed: Jan. 11, 1996

(51) Int. Cl.[7] .............................................. G06F 13/00
(52) U.S. Cl. ...................... 710/307; 710/302; 710/301; 710/62; 710/63; 710/64; 710/72
(58) Field of Search ................................. 395/281, 282, 395/283, 309, 882, 883, 884, 892, 893, 500, 527; 361/679, 684, 685, 686, 727; 439/218; 710/301, 302, 303, 305, 306, 63, 307, 62, 64, 72

(56) References Cited

U.S. PATENT DOCUMENTS

| | | | | |
|---|---|---|---|---|
| 4,573,753 A | * | 3/1986 | Vogl | 339/17 |
| 4,998,180 A | * | 3/1991 | McAuliffe et al. | 361/383 |
| 5,367,647 A | * | 11/1994 | Coulson et al. | 395/309 |
| 5,579,204 A | * | 11/1996 | Nelson et al. | 361/685 |
| 5,586,271 A | * | 12/1996 | Parrett | 395/283 |
| 5,596,757 A | * | 1/1997 | Smith | 395/750 |
| 5,613,074 A | * | 3/1997 | Galloway | 395/280 |
| 5,628,637 A | * | 5/1997 | Pecone et al. | 439/74 |
| 5,734,840 A | * | 3/1998 | Chew et al. | 395/282 |

* cited by examiner

Primary Examiner—Peter Wong
Assistant Examiner—Raymond N Phan
(74) Attorney, Agent, or Firm—D. E. Schreiber, Esq.

(57) ABSTRACT

A compact adapter for interconnecting a digital computer peripheral device that uses a Single Connector Attachment ("SCA") to a conventional Small Computer System Interface ("SCSI") bus. A SCA connector of the adapter mates with and engages a complementary SCA connector included in a peripheral device. The SCA connector is juxtaposed perpendicularly with a first face of a planar printed circuit board. A narrow width for the printed circuit board permits a disk drive mated with the adapter to fit within a space in a digital computer system adapted to receive a peripheral device. The compact adapter also includes an electrical power connector together with a first, conventional SCSI bus connector. Preferably, the adapter also includes a second, conventional SCSI bus connector having a different style from that of the first SCSI bus connector. The power connector and both SCSI bus connectors are juxtaposed with and disposed perpendicular to a second face of the printed circuit board, and electrically coupled to the SCA connector by traces on the printed circuit board.

20 Claims, 2 Drawing Sheets

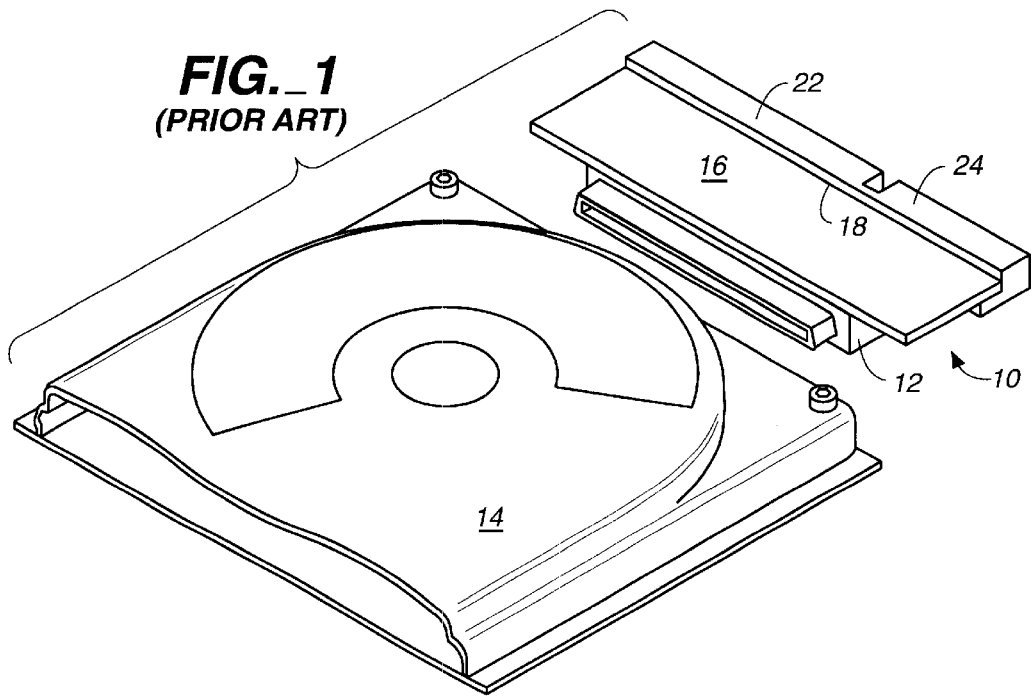
FIG._1
(PRIOR ART)
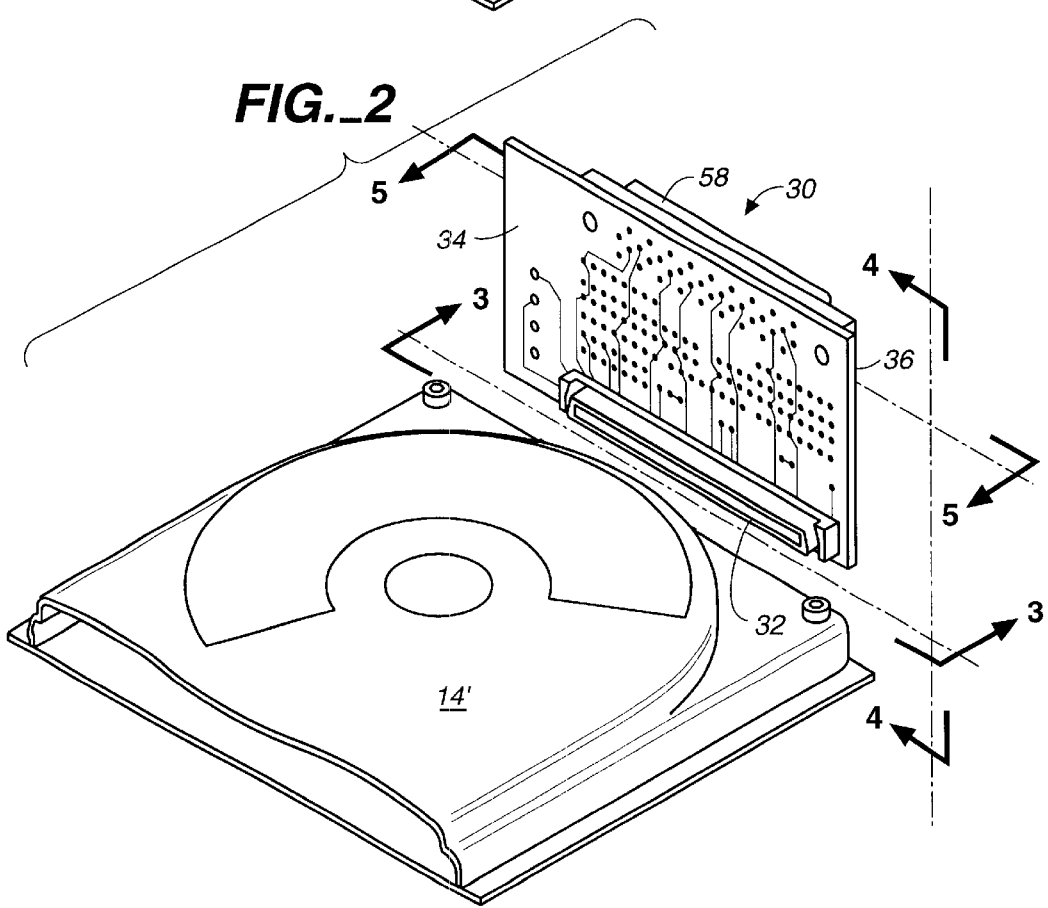
FIG._2

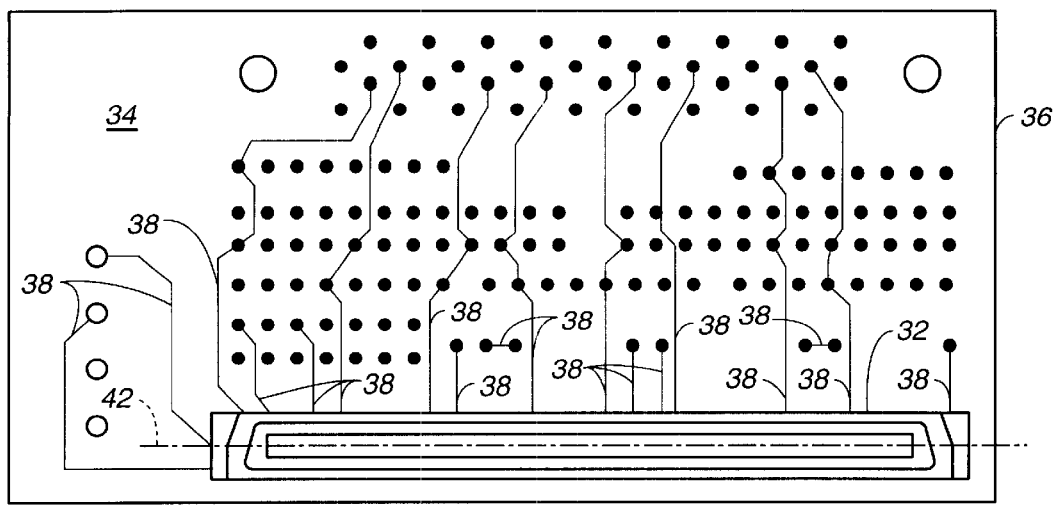
FIG._3
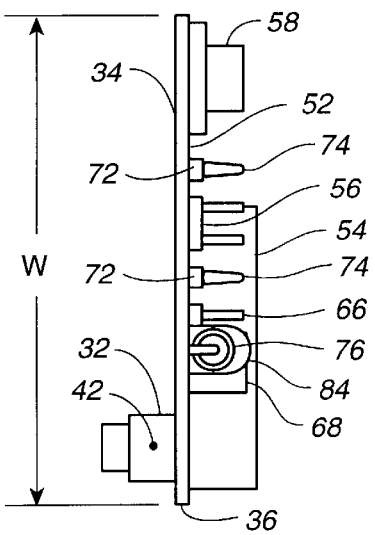
FIG._4
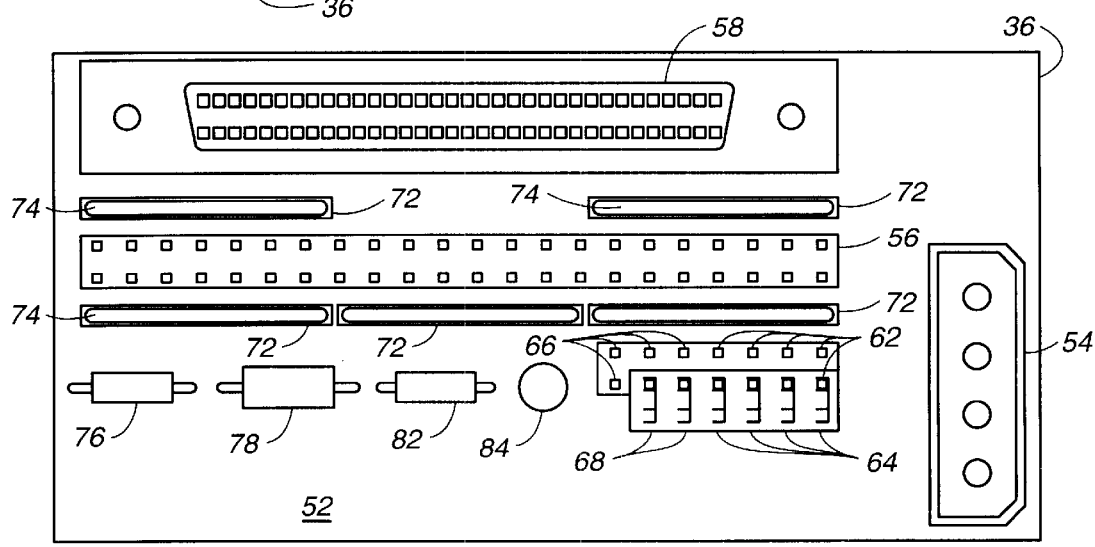
FIG._5

COMPACT AND VERSATILE SCA TO SCSI BUS ADAPTER

BACKGROUND OF THE INVENTION

1. Field of the Invention

The present invention relates generally to data storage devices for digital computers, and more specifically to adapting data storage devices for installation within a limited amount of space.

2. Description of the Prior Art

Some models of peripheral devices used in digital computer systems, such as disk drives, employ a type of electrical connector called a Single Connector Attachment ("SCA"). In numerous ways, the electrical signals used for disk drives having an SCA are included among those specified for a conventional American National Standards Institute ("ANSI") Small Computer System Interface ("SCSI") bus. However, the connector of a SCA disk drive, which couples the disk drive to a computer system, is mechanically from a conventional SCSI bus connector. For example, the SCA connector, in addition to electrical contacts for SCSI bus control and data signals, also includes electrical contacts that couple all electrical power to the disk drive. Conversely, conventional electrical connectors for the SCSI bus do not carry electrical power for energizing a disk drive's operation. Moreover, a SCA peripheral device omits some facilities, such as an ability to specify a SCSI ID bit, that must be included in a SCSI peripheral device.

Despite these incompatibilities between a SCA peripheral device and a SCSI peripheral device, at times it can become commercially advantageous to incorporate a SCA disk drive into a computer system that employs only conventional SCSI bus connectors. FIG. 1 depicts a prior art adapter-assembly, referred to by the general reference character 10, that permits such an adaptation. As depicted in FIG. 1, the adapter-assembly 10 includes a female SCA connector 12 that mates with a male SCA connector included in a SCA disk drive 14, that is not visible in any of the FIGs. The female SCA connector 12 is mounted co-planarly on and electrically interconnected to a printed circuit board 16. Also mounted along an edge 18 of and electrically connected to the printed circuit board 16 are both an conventional SCSI bus connector 22 and a conventional 4-pin electrical-power connector 24. Electrically conductive traces included in the printed circuit board 16, that are not separately depicted in FIG. 1, interconnect the female SCA connector 12 with the conventional SCSI bus connector 22 and the 4-pin electrical-power connector 24. These electrically conductive traces are arranged so the SCA disk drive 14 operates properly if the female SCA connector 12 is mated with the SCA disk drive 14, and a SCSI cable and an electrical power cable, not depicted in any of the FIGS., are respectively mated with the conventional SCSI bus connector 22 and with the 4-pin electrical-power connector 24.

However, while the prior art adapter-assembly 10 illustrated in FIG. 1 permits the SCA disk drive 14 to operate properly when connected to a computer system that employs only conventional SCSI bus connectors, a SCA disk drive 14 combined with the adapter-assembly 10 is physically longer than the space usually provided within such a computer system for a disk drive. Consequently, the prior art adapter-assembly 10, depicted in FIG. 1, addresses only the electrical problems of incorporating the SCA disk drive 14 into a computer system, while ignoring mechanical problems inherent in such an adaptation of the SCA disk drive 14.

In addition to the excessively large amount of space required by the adapter-assembly 10, the adapter-assembly 10 provides only limited compatibility with the ANSI SCSI standards. In 1986 ANSI first adopted a SCSI-I standard, and then several years later ANSI adopted a SCSI-II standard. A major objective of the SCSI-II standard is maintaining backward compatibility with those SCSI-I devices that support bus parity, and that conform to level 2 of the SCSI-1 standard. In practical terms, such backward compatibility means that, despite differences between the SCSI-I and SCSI-II standards, various SCSI-I devices operate properly if connected to a SCSI-II bus, and conversely. However, while maintaining this backward compatibility, the SCSI-II standard also permitted an additional style of connector which does not mate with the SCSI-I standard's single style of connector. The structure of the prior art adapter-assembly 10 that is depicted in FIG. 1 can accommodate only a single conventional SCSI bus connector 22 of either style. Consequently, the adapter-assembly 10 inherently possesses only a limited capability for mating with conventional SCSI-II connectors.

SUMMARY OF THE INVENTION

An object of the present invention is to provide an improved adapter for interconnecting a peripheral device that employs a SCA connector, such as a disk drive, with a conventional SCSI bus.

Another object of the present invention is to provide a more compact adapter for interconnecting a peripheral device that employs a SCA connector, such as a disk drive, with a conventional SCSI bus.

Another object of the present invention is to provide an adapter for interconnecting a peripheral device that employs a SCA connector, such as a disk drive, with a conventional SCSI bus through more than a single style of conventional SCSI bus connector.

Another object of the present invention is to provide a more compact adapter for interconnecting a peripheral device that employs a SCA connector, such as a disk drive, with a conventional SCSI bus through more than a single style of conventional SCSI bus connector.

Briefly, the present invention is a compact adapter for interconnecting a digital computer peripheral device that uses a SCA, such as a disk drive, to a conventional SCSI bus. The compact adapter includes a SCA connector adapted to mate with and engage a complementary, male SCA connector included in the peripheral device. The SCA connector is juxtaposed perpendicularly with a first face of a planar printed circuit board. The printed circuit board includes traces that electrically couple the printed circuit board to the SCA connector. To permit a disk drive, together with a mated compact adapter, to fit within a space in a digital computer system that is adapted to receive the peripheral device, the printed circuit board is formed with a narrow width parallel to the first face of the printed circuit board and perpendicular to a longitudinal axis of the SCA connector.

The compact adapter also includes an electrical power connector that is juxtaposed with and disposed perpendicular to a second face of the printed circuit board opposite to the first face to which the SCA connector juxtaposes. Traces on the printed circuit board electrically couple the electrical power connector to the SCA connector.

The compact adapter also includes a first, conventional SCSI bus connector having a style chosen from among a plurality of styles permitted for conventional SCSI-II bus connectors, The SCSI bus connector is juxtaposed with and disposed perpendicular to the second face of the printed circuit board. The SCSI bus connector is also electrically coupled to the SCA connector by traces on the printed circuit board.

In a preferred embodiment, the compact adapter includes a second, conventional SCSI-II bus connector having a style, chosen from among the plurality of styles for conventional SCSI bus connectors, that differs from the style of the first, conventional SCSI bus connector. The second SCSI bus connector is also juxtaposed with and disposed perpendicular to the second face of the printed circuit board, and electrically coupled to the SCA connector by traces on the printed circuit board.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a perspective drawing depicting a portion of a peripheral device used in a digital computer system, i.e. a disk drive, together with a prior art SCA-to-SCSI bus adapter-assembly;

FIG. 2 is a perspective drawing depicting a portion of a eripheral device used in a digital computer system, i.e. a disk drive, together with a compact SCA-to-SCSI bus adapter-assembly in accordance with the present invention;

FIG. 3 is a rear elevational view of a SCA-to-SCSI bus adapter-assembly in accordance with the present invention taken along the line 3—3 of FIG. 2;

FIG. 4 is a side elevational view of a SCA-to-SCSI bus adapter-assembly in accordance with the present invention taken along the line 4—4 of FIG. 2; and FIG. 5 is a front elevational view of a SCA-to-SCSI bus adapter-assembly in accordance with the present invention taken along the line 5—5 of FIG. 2.

DETAILED DESCRIPTION OF THE PREFERRED EMBODIMENT

Referring now to FIG. 2, depicted there is a SCA peripheral device which may be identical to the prior art SCA peripheral device depicted in FIG. 1. The SCA peripheral device of FIG. 2 carries the same reference numeral as the SCA Peripheral device of FIG. 1 distinguished by a prime ("'") designation.

FIG. 1 also depicts a compact adapter-assembly 30 that includes a female SCA connector 32 adapted to mate with and engage a complementary, male SCA connector included in the SCA disk drive 14', that is not visible in any of the FIGs. The female SCA connector 32 is juxtaposed perpendicularly with a first face 34 of a planar printed circuit board 36 that is included in the compact adapter-assembly 30. The printed circuit board 36 includes traces 38 that electrically couple the printed circuit board 36 to the female SCA connector 32. As depicted in FIG. 4, the printed circuit board 36 has a width, "W," measured parallel to the first face 34 of the printed circuit board 36, and perpendicular to a longitudinal axis 42 of the female SCA connector 32. To permit the SCA disk drive 14', together with a mated compact adapter-assembly 30, to fit within a space provided for disk drives in a digital computer system, not depicted in any of the FIGs., the printed circuit board 36 preferably has a narrow width W of approximately 1.5 inches.

Juxtaposed perpendicularly with a second face 52 of the printed circuit board 36, that is opposite to the first face 34, is a 4-pin electrical-power connector 54. The traces 38 on the printed circuit board 36 electrically couple the 4-pin electrical-power connector 54 to the female SCA connector 32. Also juxtaposed perpendicularly with the second face 52 of the printed circuit board 36 is a 50-pin dual-row-header connector 56. The 50-pin dual-row-header connector 56 is also electrically coupled to the female SCA connector 32 by traces 38 on the printed circuit board 36. The 50-pin dual-row-header connector 56 is a style of conventional connector for the SCSI bus that is specified both in the ANSI SCSI-I and in the ANSI SCSI-II standards. Preferably, the compact adapter-assembly 30 also includes a second 68-pin Amphenol-style connector 58 that is also juxtaposed perpendicularly with the second face 52 of the printed circuit board 36. The 68-pin Amphenol-style connector 58 is also electrically coupled to the female SCA connector 32 by traces 38 on the printed circuit board 36. The 68-pin Amphenol-style connector 58 is a style of conventional connector for the SCSI bus that is not specified in the ANSI SCSI-I standard, but is specified in the ANSI SCSI-II standard.

As set forth above, the SCA disk drive 14' omits some facilities that must be included in a SCSI peripheral device, such as an ability to specify a SCSI ID bit. To permit assigning a SCSI ID bit to a peripheral device such as the SCA disk drive 14', the compact adapter-assembly 30 includes four (4) pairs of jumper pins 62 that are juxtaposed with the second face 52 of the printed circuit board 36, and that are electrically coupled to the female SCA connector 32 by traces 38 on the printed circuit board 36. Removable electrical jumpers 64, that are selectively pressed onto pairs of the jumper pins 62, assign a SCSI ID bit of zero (0) to (15) to the SCA disk drive 14'. Other pairs of jumper pins 66, that are juxtaposed with the second face 52 of the printed circuit board 36 and electrically coupled to the female SCA connector 32 by traces 38 on the printed circuit board 36 together with removable electrical jumpers 68, permit specifying additional operating characteristics of the SCA disk drive 14' such as spindle synchronization, remote start, and delayed start.

As is well known in the art and expressly set forth in both ANSI standards for the SCSI bus, a peripheral device which is located at either end of a SCSI bus must provide electrical termination for each signal line included in the SCSI bus. Similar to the omission of a SCSI ID bit, the SCA disk drive 14' also lacks an ability to provide SCSI bus electrical termination. Consequently, two rows of termination-resistor sockets 72 are juxtaposed with the second face 52 of the printed circuit board 36 and coupled to the female SCA connector 32 by traces 38 on the printed circuit board 36. If the SCA disk drive 14' is located at either end of a SCSI bus, then the termination-resistor sockets 72 receive termination-resistor packs 74 that are inserted into the termination-resistor sockets 72.

As is well known in the art and expressly set forth in both ANSI standards for the SCSI bus, each peripheral device connected to a SCSI bus must provide terminator power to the SCSI bus. Similar to the omission of a SCSI ID bit and termination resistors, the SCA disk drive 14' also lacks an ability to provide terminator power to the SCSI bus. Consequently, the compact adapter-assembly 30 includes a series connected diode 76 and fuse 78, that are coupled to the 50-pin dual-row-header connector 56 and the 68-pin Amphenol-style connector 58 by traces 38 on the printed circuit board 36, for supplying terminator power to a SCSI bus.

The compact adapter-assembly 30 includes a series connected resistor 82 and light emitting diode ("LED") 84, that are coupled to the female SCA connector 32 by traces 38 on the printed circuit board 36, for visually indicating when peripheral-device I/O activity occurs.

Although the present invention has been described in terms of the presently preferred embodiment, it is to be understood that such disclosure is purely illustrative and is not to be interpreted as limiting. For example, while the termination-resistor sockets 72 and the termination-resistor packs 74 are presently preferred for electrically terminating the SCSI bus, active bus termination may be used instead. Accordingly, the termination-resistor sockets 72 and the termination-resistor packs 74 may be replaced by MLC509CS Active SCSI Terminator ICs manufactured by Micro Linear of San Jose, California. Under such circumstances, additional jumper pins 66 and removable electrical jumpers 68 would be added to the adapter-assembly 10 and used to activate or deactivate the MLC509CS Active SCSI Terminator ICs. As is well known to those skilled in the art, the jumper pins 66 and the removable electrical jumpers 68 would be used to activate or deactivate the MLC509CS Active SCSI Terminator ICs depending upon whether the adapter-assembly 10 was located at an end of the SCSI bus, or located between the ends of the SCSI bus.

Similarly, while the preferred means for assigning a SCSI ID bit to the SCA disk drive 14' is preferably the pairs of jumper pins 62 and removable electrical jumpers 64, and the pairs of jumper pins 66 together with the removable electrical jumpers 68 are preferred for specifying other operating characteristics of the SCA disk drive 14', alternative equivalent devices, such as electrical switches, may instead be used for such purposes, and/or for activating and deactivating MLC509CS Active SCSI Terminator ICs if included in the adapter-assembly 10.

Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A compact adapter for interconnecting a digital computer peripheral device that uses a Single Connector Attachment ("SCA") to a conventional American National Standards Institute ("ANSI") Small Computer System Interface ("SCSI") bus, the adapter comprising:

a SCA connector adapted to mate with and engage a complementary SCA connector included in a peripheral device;

a planar printed circuit board having a first face that is juxtaposed with and that is perpendicular to said SCA connector, said printed circuit board including traces that electrically couple said printed circuit board to said SCA connector, said printed circuit board having a width parallel to the first face of said printed circuit board and perpendicular to a longitudinal axis of said SCA connector that is sufficiently narrow to permit a peripheral device, when said SCA connector of the adapter is mated with and engaging a complementary SCA connector of a peripheral device, to fit within a space in a digital computer system that is adapted to receive the peripheral device;

an electrical power connector that is juxtaposed with and disposed perpendicular to a second face of said printed circuit board, said electrical power connector being electrically coupled to said SCA connector by traces on said printed circuit board;

a first, conventional SCSI bus connector having a style chosen from among a plurality of styles for conventional SCSI bus connectors, said SCSI bus connector being juxtaposed with and disposed perpendicular to the second face of said printed circuit board, and said SCSI bus connector being electrically coupled to said SCA connector by traces on said printed circuit board; and SCSI bus electrical termination means adapted for selectively providing termination for electrical signals present on the SCSI bus depending upon a location at which the compact adapter is positioned along the SCSI bus.

2. The compact adapter of claim 1 further comprising a second, conventional SCSI bus connector having a style chosen from among the plurality of styles for conventional SCSI bus connectors that differs from the style of said first, conventional SCSI bus connector, said second SCSI bus connector being juxtaposed with and disposed perpendicular to the second face of said printed circuit board, and said second SCSI bus connector being coupled to said SCA connector by traces on said printed circuit board.

3. The compact adapter of claim 1 further comprising selection means, secured to said printed circuit board and electrically coupled to said SCA connector by traces on said printed circuit board, for assigning a SCSI ID bit to a peripheral device that is mated with said SCA connector.

4. The compact adapter of claim 3 wherein said selection means includes pairs of jumper pins secured to said printed circuit board onto which are pressed removable electrical jumpers.

5. The compact adapter of claim 3 wherein said SCSI bus electrical termination means includes a socket for receiving a SCSI bus terminator-resistor pack, said socket being secured to said printed circuit board and electrically coupled to said SCA connector by traces on said printed circuit board.

6. The compact adapter of claim 5 wherein said SCSI bus electrical termination means includes a SCSI bus terminator-resistor pack inserted into said socket.

7. The compact adapter of claim 5 wherein said SCSI bus electrical termination means includestermination-power means, coupled to said SCA connector by traces on said printed circuit board, for supplying termination power to a SCSI bus.

8. The compact adapter of claim 5 further comprising peripheral-device-activity display means, coupled to said SCA connector by traces on said printed circuit board, for visually indicating an occurrence of peripheral device activity.

9. The compact adapter of claim 8 wherein said peripheral-device-activity display means includes a light emitting diode ("LED").

10. The compact adapter of claim 3 wherein said SCSI bus electrical termination means includes an active SCSI bus terminator secured to said printed circuit board and electrically coupled to said SCA connector by traces on said printed circuit board.

11. The compact adapter of claim 10 wherein said SCSI bus electrical termination means includes termination power, coupled to said SCA connector by traces on said printed circuit board, for supplying termination power to a SCSI bus.

12. The compact adapter of claim 3 further comprising peripheral-device-activity display means, coupled to said SCA connector by traces on said printed circuit board, for visually indicating an occurrence of peripheral device activity.

13. The compact adapter of claim 12 wherein said peripheral-device-activity display means includes a LED.

14. The compact adapter of claim 1 wherein said SCSI bus electrical termination means includes a socket for receiving a SCSI bus terminator-resistor pack, said socket being secured to said printed circuit board and electrically coupled to said SCA connector by traces on said printed circuit board.

15. The compact adapter of claim 14 wherein said SCSI bus electrical termination means includes a SCSI bus terminator-resistor pack inserted into said socket.

16. The compact adapter of claim 1 wherein said SCSI bus electrical termination means includes termination power, coupled to said SCA connector by traces on said printed circuit board, for supplying termination power to a SCSI bus.

17. The compact adapter of claim 1 further comprising peripheral-device-activity display means, coupled to said SCA connector by traces on said printed circuit board, for visually indicating an occurrence of peripheral device activity.

18. The compact adapter of claim 17 wherein said peripheral-device-activity display means includes a LED.

19. The compact adapter of claim 1 wherein said SCSI bus electrical termination means includes an active SCSI bus terminator secured to said printed circuit board and electrically coupled to said SCA connector by traces on said printed circuit board.

20. The compact adapter of claim 19 wherein said SCSI bus electrical termination means includes termination power, coupled to said SCA connector by traces on said printed circuit board, for supplying termination power to a SCSI bus.

* * * * *